(12) United States Patent
Mahant Shetti et al.

(10) Patent No.: US 9,595,953 B2
(45) Date of Patent: Mar. 14, 2017

(54) CONFIGURATION OF JFET FOR BASE DRIVE BIPOLAR JUNCTION TRANSISTOR WITH AUTOMATIC COMPENSATION OF BETA VARIATION

(71) Applicant: Shivaling Shrishail Mahant Shetti, Belgaum (IN)

(72) Inventors: Shivaling Shrishail Mahant Shetti, Belgaum (IN); Vithal Dalawayi Shankar, Bagalkot (IN); Ameensab Mujavar Yamanursab, Bagalkot (IN); Nagesh Turadi Mudakappa, Belgaum (IN); Bharthi Patil Shekar, Belgaum (IN); Kashinath Shekugol Satyappa, Bijapur (IN); Venkappa Bhajantri Hanumantappa, Belgaum (IN); Suma Patil Manjanagouda, Haveri (IN); Nastheen Mokhashi Ismail, Belgaum (IN)

( * ) Notice: Subject to any disclaimer, the term of this patent is extended or adjusted under 35 U.S.C. 154(b) by 0 days.

(21) Appl. No.: 14/963,476

(22) Filed: Dec. 9, 2015

(65) Prior Publication Data
US 2016/0164512 A1 Jun. 9, 2016

(30) Foreign Application Priority Data
Dec. 9, 2014 (IN) ............................ 6223/CHE/2014

(51) Int. Cl.
*H03B 1/00* (2006.01)
*H03K 3/00* (2006.01)
(Continued)

(52) U.S. Cl.
CPC ........... *H03K 17/168* (2013.01); *H03K 17/14* (2013.01); *H03K 17/60* (2013.01); *H03K 17/687* (2013.01)

(58) Field of Classification Search
CPC ..... H03K 17/168; H03K 17/687; H03K 17/60
(Continued)

(56) References Cited

U.S. PATENT DOCUMENTS

| 4,590,389 A * | 5/1986 | Cave ..................... H03K 17/567 327/381 |
| 6,201,431 B1 * | 3/2001 | Allen ............... H03K 19/00346 326/21 |

(Continued)

*Primary Examiner* — Lincoln Donovan
*Assistant Examiner* — Thomas Skibinski
(74) *Attorney, Agent, or Firm* — The Law Office of Austin Bonderer, PC; Austin Bonderer

(57) ABSTRACT

A circuit for automatically compensating beta variation by driving base of BJT with JFET is disclosed. The circuit includes a first well, a second well, a third well, one or more leakage current devices, and a varying metal connection. The first well includes first JFET J1, second JFET J2, third JFET J3 and fourth JFET J4. The input voltage value is combination of emitter to base voltage of first BJT Q1, emitter to base voltage of second BJT Q2. The second well includes first BJT Q1, second BJT Q2 and second diode D2. The third well includes first diode snubber D1. The one or more leakage current devices are connected between base of Q1 and base Q2 to remove excess leakage current across the second well. The varying metal connection is connected across the first well, the second well and the third well to obtain beta value.

8 Claims, 4 Drawing Sheets

(51) Int. Cl.
*H03K 17/16* (2006.01)
*H03K 17/687* (2006.01)
*H03K 17/60* (2006.01)
*H03K 17/14* (2006.01)

(58) Field of Classification Search
USPC ............... 327/108–112, 427, 434, 437, 379; 326/82, 83, 87
See application file for complete search history.

(56) References Cited

U.S. PATENT DOCUMENTS

| 6,323,701 | B1* | 11/2001 | Gradinariu | ......... | H03K 19/0013 307/412 |
| 2013/0063200 | A1* | 3/2013 | Itoh | ................. | H03K 19/00315 327/434 |

* cited by examiner though the resistor connected to the base to control the current. FIG. 1 is a typical circuit diagram that illustrates resistors configured with bipolar junction transistors in a Darlington pair configuration. The circuit diagram 100 includes resistors 102A-C, bipolar junction transistors 104A-B. The resistors 102A-C are base current controlling resistors. The resistors 102A-C are used to interface a logic signal driver used in peripheral devices such as (a) a stepper motor, (b) relays, (c) bulbs, (d) LEDs, (e) print head hammers, and (f) brushless DC motors. The peripheral devices are characterized by (a) high voltage (i.e. 50-100 volts), (b) high current (i.e. 500 mA peak to several amperes), and (c) Often inductive. In the circuit 100, different source voltages are addressed, when a separate device is provided for each voltage range. For example, the resistors 102A-C are integrated into a monolithic integrated circuit. Hence, the resistors 102A-C required in the Darlington pair configuration to address the base current control sources with different input voltage ranges. In one embodiment, the resistors are 2.7 kilo ohms or 10.5 kilo ohms. The bipolar junction transistors 104A-B are involved in the Darlington pair configuration. In the Darlington pair configuration, an equivalent base current of the transistor 104A is amplified and becomes the base current of transistor 104B. When the base of the transistor 104A is open, a collector to emitter current equal to beta times a leakage current from collector to base current of transistor 104A flows into the base of 104B. The emitter current becomes the base current of the transistor 104B and hence large load current can flow. This load current can lead to faulty operation and large power dissipation. In order to avoid the large load current flow, large number of resistors (e.g., the resistors 102A-C) is provided in the Darlington pair configuration. Hence, the chip area of the Darlington pair configuration is high. Accordingly there remains need

CONFIGURATION OF JFET FOR BASE DRIVE BIPOLAR JUNCTION TRANSISTOR WITH AUTOMATIC COMPENSATION OF BETA VARIATION

CROSS-REFERENCE TO RELATED APPLICATIONS

This application claims priority to Indian patent application no. 6223/CHE/2014 filed on Dec. 9, 2014, the complete disclosure of which, in its entirely, is herein incorporated by reference.

BACKGROUND

Technical Field

The embodiments herein generally relate to a junction gate field-effect transistor, and, more particularly, configuring a junction gate field-effect transistor (JFET) with a bipolar junction transistor (BJT) for a logic driven device with automatic compensation of beta variation and to reduce a chip area of a circuit.

Description of the Related Art

Bipolar junction transistors are one of the many power devices. The bipolar junction transistors are used as Darlington pairs, low Vice (sat) bipolar junction transistors and/or high beta transistors. Since bipolar junction transistors are current driven devices, resistors are necessarily connected to the base of the bipolar junction transistors to control base current. In the bipolar junction transistors, a collector gets a bias through a load, and a base gets a bias for providing a logic driven device with better compensation of beta variation and to reduce a chip area of a circuit.

SUMMARY

In view of a foregoing, a circuit for automatically compensating beta variation in a bipolar junction transistor by driving base of the BJT with a JFET is disclosed. The circuit includes a first well, a second well, a third well, one or more leakage current devices, and a varying metal connection. The first well includes a first junction field effect transistor (J1), a second junction field effect transistor (J2), a third junction field effect transistor (J3) and a fourth junction field effect transistor (J4). A gate of the first junction field effect transistor (J1), a gate of the second junction field effect transistor (J2), a gate of the third junction field effect transistor (J3) and a gate of the fourth junction field effect transistor (J4) are shorted together and an input voltage (IN) is applied at a shorted terminal of the J1, the J2, the J3, and the J4. The input voltage value is derived from a combination of an emitter to base voltage of a first bipolar junction transistor Q1, an emitter to base voltage of a second bipolar junction transistor Q2 and an input voltage value ranging between 3 volts to greater than break down voltage of PJFET depending on a type of electronic circuit being designed.

The second well includes the first bipolar junction transistor (Q1), the second bipolar junction transistor (Q2) and a second diode (D2). A collector of Q1 is connected to an anode of the D2 and a collector of Q2 is connected to an anode of a first diode snubber (D1). The third well includes the first diode snubber (D1). The first diode snubber suppresses the rise in voltage across the Q2. The one or more leakage current devices is connected between a base of Q1 and a base Q2 to remove excess leakage current across the second well. The varying metal connection is connected around the first well, the second well and the third well to obtain a beta value for different types of electronic circuits. The one or more leakage current devices include a first leakage current device B0 and a second leakage current device B1. The first leakage current device B0 checks a leakage current across the Q1 and the second leakage current device B1 checks a leakage current across the J3.

An emitter of Q1 and an emitter of Q2 are connected through the varying metal connection at a ground potential or at a different mode depending on the type of electronic circuit being designed. The J1, J2 and J4 are configured to behave as current source replacing resistors and when there is a high input voltage then the J1, J2 and J4 are shut off and the high input voltage depends upon the type of electronic circuit being designed. The one or more leakage current devices are connected at points ES1, ES, and Q2B to remove excess current between emitter of the Q1 and drain of J2, and between emitter of the Q1 and base of the Q2.

In one aspect, a method for automatically compensating beta variation in a bipolar junction transistor by driving base of the BJT with a JFET is disclosed. The method includes the following steps: (i) configuring a first junction field effect transistor (J1), a second junction field effect transistor (J2), a third junction field effect transistor (J3) and a fourth junction field effect transistor (J4) in a first well, (ii) shorting a gate of the first junction field effect transistor (J1), a gate of the second junction field effect transistor (J2), a gate of the third junction field effect transistor (J3) and a gate of the fourth junction field effect transistor (J4), (iii) applying input voltage (IN) at a shorted terminal of the gate of the first junction field effect transistor (J1), the gate of the second junction field effect transistor (J2), the gate of the third junction field effect transistor (J3) and the gate of the fourth junction field effect transistor (J4), (iv) checking if there is excess leakage current across the J3 and removing the excess leakage current through a second leakage current device B1, (v) configuring a first bipolar junction transistor (Q1), a second bipolar junction transistor (Q2) and a second diode (D2) in a second well and a collector of the Q1 is connected to an anode of the D2 and a collector of the Q2 is connected to an anode of a first diode snubber (D1), (vi) connecting one or more leakage current devices across a base of Q1 and a base Q2 to remove excess leakage current from the second well, (vii) configuring the first diode snubber (D1) in a third well and the first diode snubber suppresses the rise in voltage across the Q2, and (viii) configuring a varying metal connection across the first well, the second well and the third well to obtain a beta value for different types of electronic circuits.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 2:
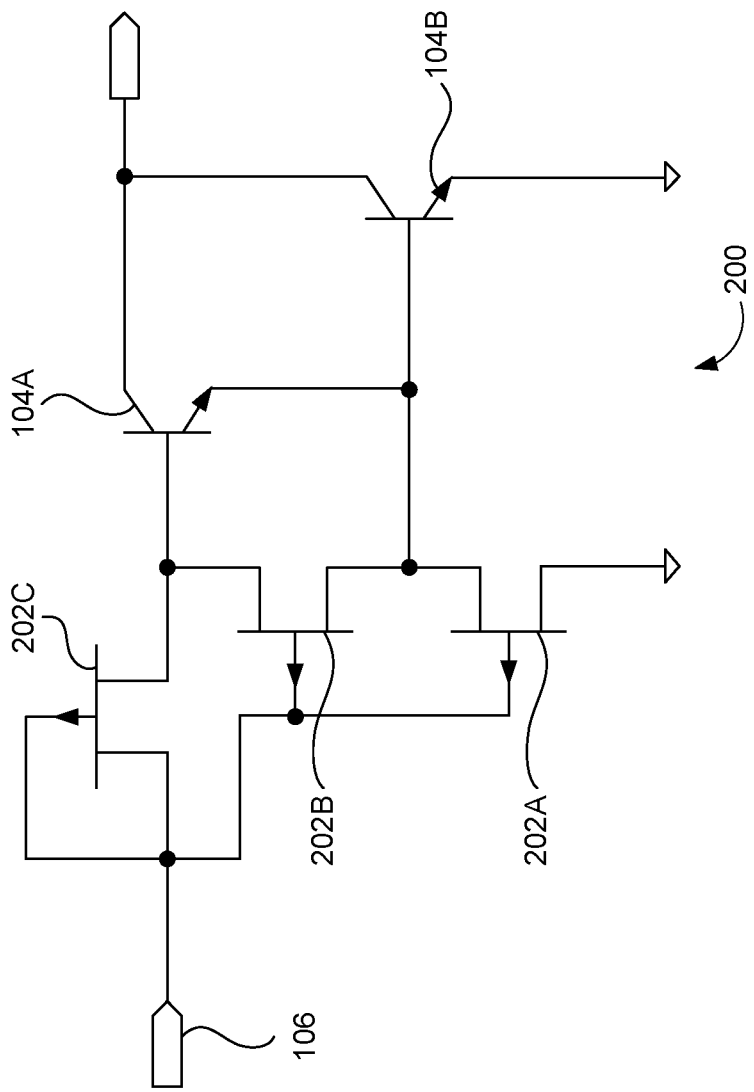
FIG. 2 is a circuit diagram that illustrates JFETs that are configured with the bipolar junction transistors in a Darlington pair configuration for providing a logic driven device with automatic compensation of beta variation according to an embodiment herein.
Figure 3:
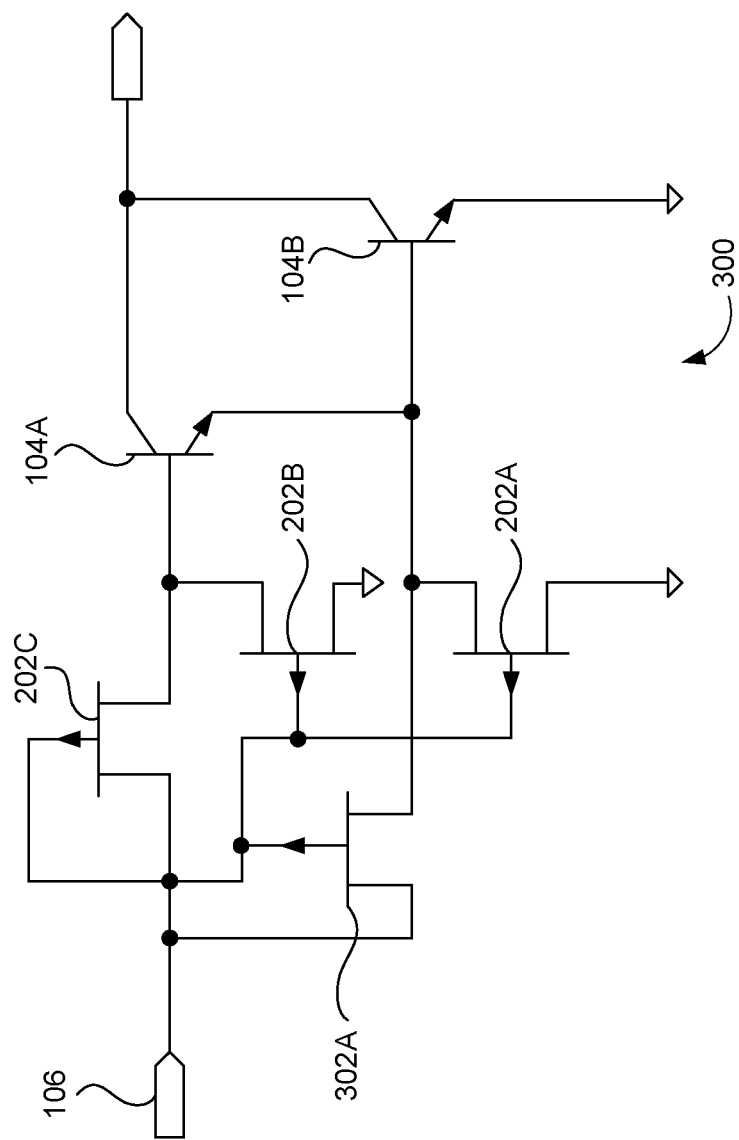
FIG. 3 is a circuit diagram that illustrates the JFETs that are individually configured with the bipolar junction transistors for reducing the chip area of FIG. 1 according to an embodiment herein.
Figure 4:
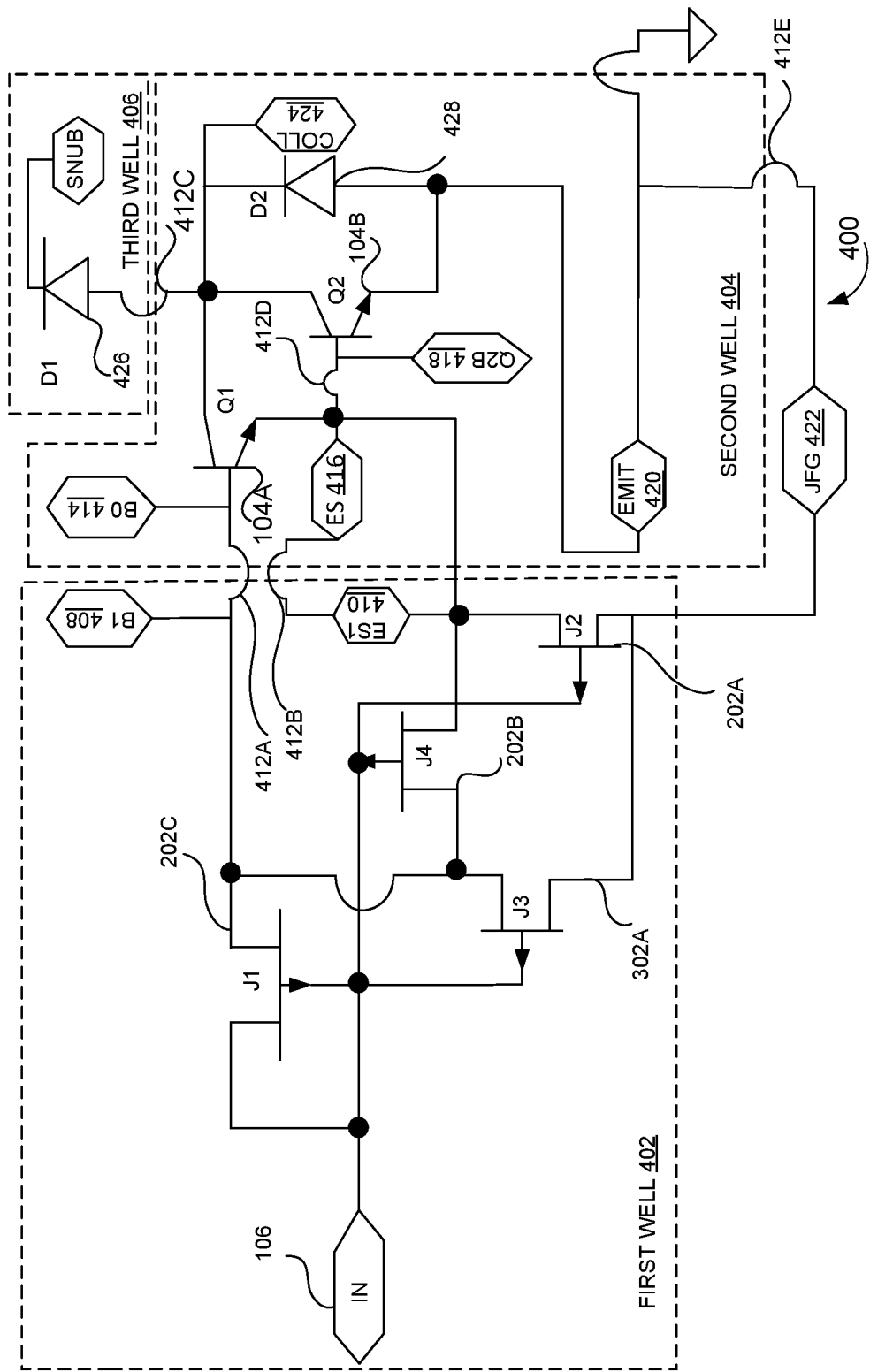
FIG. 4 is a circuit diagram that illustrates the JFETs, the BJT's and a diode snubber configured in a first well, a second well and a third well according to an embodiment herein.

As mentioned, there remains a need for providing a logic driven device with automatic compensation of beta variation. The embodiments herein achieve this by configuring a JFET with a bipolar junction transistor in a Darlington pair configuration. The JFET with the bipolar junction transistor to provide the logic driven device with automatic compensation of beta variation. A chip area is also reduced by configuring the JFET with the bipolar junction transistors in the Darlington pair configuration. Further no input current is wasted by configuring the JFET with the bipolar junction transistor in the Darlington pair configuration. Referring now to the drawings, and more particularly to FIGS. 2 through 4, where similar reference characters denote corresponding features consistently throughout the figures, there are shown preferred embodiments.

FIG. 2 is a circuit diagram that illustrates JFETs that are configured with the bipolar junction transistors in a Darlington pair configuration for providing a logic driven device with automatic compensation of beta variation according to an embodiment. The circuit 200 includes JFETs 202A-C. The configuration of JFETs 202A-C with the bipolar junction transistors 104A-B is provided a logic driven device with automatic compensation of beta variation. An equivalent resistance of the JFETs 202A-C increases and a base drive of bipolar junction transistors 104A-B increases when (a) a base width of the bipolar junction transistors 104A-B is reduced due to process variation and leads to a higher collector current gain of the bipolar junction transistors 104A-B. Similarly the JFETs 202A-C current compensates for reduced bipolar junction transistors 104A-B gain with increased JFETs 202A-C current, when a base doping of the bipolar junction transistors 104A-B is increased, and (b) the gain of the bipolar transistors 104A-B is reduced. In an embodiment, the JFETS are current source that replace a resistor while a) Being better matched to one bipolar device b) allowing for increased input voltage range (min 1.5+1.4 to breakdown voltage of PJFET), and c) completely shutting off leakage transistors during normal operation.

Further, Gate voltage of the JFETs 202A-C is same as base voltage of the bipolar junction transistors when the input voltage 106 is float stage. Hence, all leakage current allowed into the circuit 200 is removed. Based on the input voltage is increased, then the JFETs 202A-C at the base shuts off allowing all the input current to feed the base of the bipolar junction transistors 104A-B (i.e. saturated such that drain to source voltage of the JFETs 202A-C (e.g., NPN's) is not increased with drain to source current of the JFETs 202A-C) when the input voltage 106 is increased. Therefore, as a result no input current is wasted. The JFETs 202A-C may be a P-JFET when the bipolar junction transistors 104A-B are NPN transistor and an N-JFET when 104A-B are PNP transistor.

Figure 1:
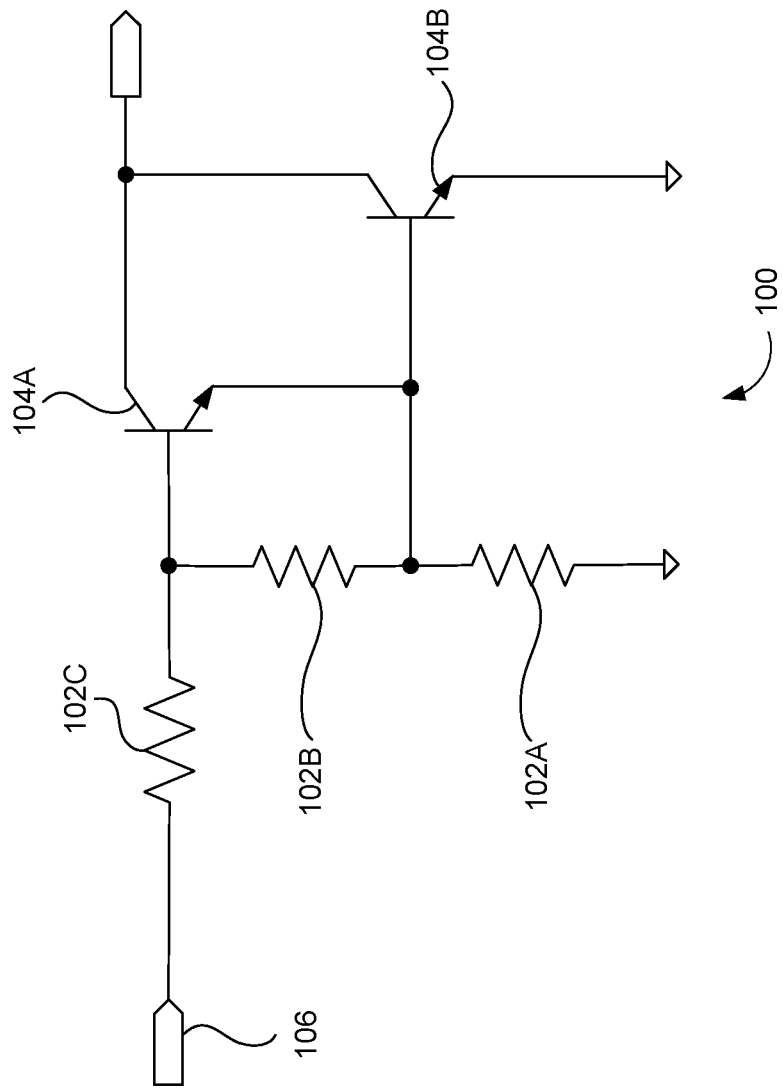
FIG. 1 is a typical circuit diagram that illustrates resistors configured with bipolar junction transistors in a Darlington pair configuration.

FIG. 3 is a circuit diagram 300 that illustrates the JFETs that is individually configured with the bipolar junction transistors for reducing the chip area of FIG. 1 according to an embodiment. The circuit 300 includes JFET 302A. In the circuit 300, the JFET 202A and 202B are individually configured with the associated bipolar junction transistors 104A-B. The JFET 302A is provided for leakage of second bipolar junction transistor 104B that biases the JFETs 202A-C in the circuit 300. A separate isolation areas are avoided. An emitter of the bipolar junction transistor provide and a single well provide gate for all the JFETs 202A-C and the JFET 302A. Hence, an addition of the JFET is not increased the chip area. In one embodiment, a zener diode is placed in series with input voltage 106 and the implementation may overcome any gate to drain breakdown of the JFETs 202A-C, and the JFET 302A.

The JFETs are configured with the bipolar junction transistors for providing the logic driven device with automatic compensation of beta variation. The JFETs are configured with the bipolar junction transistors for reducing the chip area of the circuit. A larger payoff is that the base current of the bipolar junction transistors is independent of a large variation in input voltage. There is no need of providing resistor values in the multiple devices. Hence, the single device with the JFETs accomplishes the function of multiple devices implemented with resistors. Further no input current is wasted by the configuration since the leakage control JFETs are shut off and all the base current is used in the bipolar junction transistors. There is one or more passive current source with compensating properties.

The layout of the P JFETs is compact and consumes much less chip area than that of the resistors. In prior art, a resistor is connected in series with another resistor to reduce the overall area requirement of the implementation. Large value resistors take up a large silicon area. These resistors can also be replaced by P JFETs. While keeping the limitation of a lack of power supply intact, by adding a P JFET to NPN transistor and by extension an N JFET to a PNP transistor to make as an effect voltage controlled devices. By integrating the JFETs with the transistor during processing, beta variation of the bipolar can be compensated by the correlated variation of base current. The JFET configuration needs the JFET gates to be a shared circuit node, which supports the need for area costly separate n-EPI regions for each transistor since the n EPI is also the bottom gate of the devices. Noting that the design rules for n EPI require large dimensions, the present implementation results in a very compact system.

FIG. 4 is a circuit diagram that illustrates the JFETs, the BJT's and a diode snubber configured in a first well, a second well and a third well according to an embodiment. The circuit diagram 400 includes a first well 402, a second well 404, and a third well 406. The first well 402 includes a first junction field effect transistor (J1) 202C, a second junction field effect transistor (J2) 202A, a third junction field effect transistor (J3) 302A and a fourth junction field effect transistor (J4) 202B. A gate of the first junction field effect transistor (J1) 202C, a gate of the second junction field effect transistor (J2) 202A, a gate of the third junction field effect transistor (J3) 302A and a gate of the fourth junction field effect transistor (J4) 202B are short together and an input voltage (IN) is applied at a shorted terminal of the J1 202C, the J2 202A, the J3 302A, and the J4 202B. The input voltage 116 value is derived from a combination of a emitter to base voltage of Q1 104A, a emitter to base voltage of Q2 104B and a voltage value ranging between 3 volts to greater than break down voltage of PJFET depending on a type of electronic circuit being designed. The second well includes a first bipolar junction transistor (Q1) 104A, a second bipolar junction transistor (Q2) 104B and a second diode (D2) 428. A collector of Q1 104A is connected to an anode of the D2 428 and a collector of Q2 104B is connected to an anode of a first diode snubber (D1) 426. The third well 406 includes first diode snubber (D1) 426. The first diode snubber suppress the rise in voltage across the Q2 104B. One or more leakage current devices is connected between a base of Q1 104A and a base Q2 104B to remove excess leakage current across the second well 404. In an embodiment, the first well, the second well and the third well is a combination of n-well and p-well. In an embodiment, the one or more leakage current devices may be a PJFET. A varying metal connection 412A-E is connected across the first well 402, the second well 404 and the third well 406 to obtain a beta value for different types of electronic circuits. For example, the varying metal connection connects the emitter of Q1 to base of Q2 in the second well, if a different electronic circuit requires connection from emitter of Q2 then without crossing the connection between the emitter of Q1 and base of Q2, the varying metal connection is taken from emitter of Q2 hence by using the varying metal connection it is possible to obtain two connection from emitter of Q2. In an embodiment, the current at the base of Q1 and Q2 to drive the varying beta value to obtain 500 mA of output current.

A first leakage current device B0 414 may be used to check a leakage current across the Q1 104A and the second leakage current device B1 408 may be used to check a leakage current across the J3 302A. An emitter of Q1 104A and an emitter of Q2 104B are connected using a varying metal connection 412A-B at a ground potential or at a different mode depending on the type of electronic circuit being designed. The J1 202C, J2 202A and J4 202B are configured to behave as resistors and when there is a high input voltage then the J1 202C, J2 202A and J4 202B are shut off. The high input voltage depends upon the type of electronic circuit being designed. One or more leakage current devices are connected at points ES1 410, ES 416, and Q2B 418 to remove excess current between emitter of the Q1 104A and drain of the J2 202A, and between emitter of the Q1 104A and base of the Q2 104B. In an embodiment, one NPN transistor is compensated by JFET and not necessarily a Darlington pair.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A circuit for automatically compensating beta variation in a bipolar junction transistor by driving base of the BJT with a JFET, comprising:

a first well (402), comprises a first junction field effect transistor (J1) (202C), a second junction field effect transistor (J2) (202A), a third junction field effect transistor (J3) (302A) and a fourth junction field effect transistor (J4) (202B), wherein a gate of said first junction field effect transistor (J1) (202C), a gate of said second junction field effect transistor (J2) (202A), a gate of said third junction field effect transistor (J3) (302A) and a gate of said fourth junction field effect transistor (J4) (202B) are shorted together;

a second well (404), comprises a first bipolar junction transistor (Q1) (104A), a second bipolar junction transistor (Q2) (104B) and a second diode (D2) (428), wherein a collector of Q1 (104A) is connected to an anode of said D2 (428) and a collector of Q2 (104B) is connected to an anode of a first diode snubber (D1) (426);

a third well (406), comprises said first diode snubber (D1) (426), wherein said first diode snubber suppresses the rise in voltage across said Q2 (104B);

a plurality of leakage current devices, wherein said plurality of leakage current devices is configured between a base of Q1 (104A) and a base Q2 (l04B) to remove excess leakage current across said second well (404); and a varying metal connection (412A-E) is configured around said first well (402), said second well (404) and said third well (406) to obtain a beta value for different types of electronic circuits.

2. The circuit of claim 1, wherein an input voltage (IN) is applied at a shorted terminal of said J1 (202C), said J2 (202A), said J3 (302A), and said J4 (202B) and said input voltage (116) value is derived from a combination of a emitter to base voltage of Q1 (104A), a emitter to base voltage of Q2 (104B) and an input voltage value ranging between 3 volts to greater than break down voltage of PJFET depending on a type of electronic circuit being designed.

3. The circuit of claim 1, further comprises a first leakage current device B0 (414) and a second leakage current device B1 (408), wherein said first leakage current device B0 (414) is configured to check a leakage current across said Q1 (104A) and said second leakage current device B1 (408) is configured to check a leakage current across said J3 (302A).

4. The circuit of claim 1, wherein an emitter of Q1 (104A) and an emitter of Q2 (104B) are configured through varying metal connection (412A-B) at a ground potential or at a different mode depending on said type of electronic circuit being designed.

5. The circuit of claim 1, wherein said J1 (202C), J2 (202A) and J4 (202B) are configured to behave as current source replacing resistors and when there is a high input voltage then said J1 (202C), J2 (202A) and J4 (202B) are shut off wherein said high input voltage depends upon said type of electronic circuit being designed.

6. The circuit of claim 1, wherein said plurality of leakage current devices are connected at points ES1 (410), ES (416), and Q2B (418) to remove excess current between emitter of said Q1 (104A) and drain of said J2 (202A), and between emitter of said Q1 (104A) and base of said Q2 (104B).

7. A method for automatically compensating beta variation in a bipolar junction transistor by driving base of the BJT with a JFET, said method comprising:

configuring a first junction field effect transistor (J1) (202C), a second junction field effect transistor (J2) (202A), a third junction field effect transistor (J3) (302A) and a fourth junction field effect transistor (J4) (202B) in a first well (402);

shorting a gate of said first junction field effect transistor (J1) (202C), a gate of said second junction field effect transistor (J2) (202A), a gate of said third junction field effect transistor (J3) (302A) and a gate of said fourth junction field effect transistor (J4) (202B);

applying an input voltage (IN) at a shorted terminal of said gate of said first junction field effect transistor (J1) (202C), said gate of said second junction field effect transistor (J2) (202A), said gate of said third junction field effect transistor (J3) 302A and said gate of said fourth junction field effect transistor (J4) (202B); and checking if there is excess leakage current across said J3 (302A) and removing the excess leakage current through a leakage current device B1 (408).

8. The method of claim 7, wherein said method further comprises following steps, configuring a first bipolar junction transistor (Q1) (104A), a second bipolar junction transistor (Q2) (104B) and a second diode (D2) (428) in a second well (404), wherein a collector of said Q1 (104A) is connected to an anode of said D2 (428) and a collector of said Q2 (104B) is connected to an anode of a first diode snubber (D1) (426);

connecting a plurality of leakage current devices across a base of Q1 (104A) and a base Q2 (104B) to remove excess leakage current from said second well (404);

configuring said first diode snubber (D1) (426) in a third well (406), wherein said first diode snubber suppress the rise in voltage across said Q2 (104B); and configuring a varying metal connection (412A-E) across said first well (402), said second well (404) and said third well (406) to obtain a beta value for different types of electronic circuits.

\* \* \* \* \*